United States Patent
Hensel

(10) Patent No.: US 9,940,432 B1
(45) Date of Patent: Apr. 10, 2018

(54) DEVELOPMENT OF AN UNMANNED AERIAL VEHICLE

(71) Applicant: Amazon Technologies, Inc., Seattle, WA (US)

(72) Inventor: Fabian Hensel, Zurich (CH)

(73) Assignee: Amazon Technologies, Inc., Seattle, WA (US)

( * ) Notice: Subject to any disclaimer, the term of this patent is extended or adjusted under 35 U.S.C. 154(b) by 645 days.

(21) Appl. No.: 14/547,018

(22) Filed: Nov. 18, 2014

(51) Int. Cl.
*B64F 5/00* (2017.01)
*G06F 17/50* (2006.01)
*B64C 39/02* (2006.01)
*G05D 1/00* (2006.01)
*B64D 1/10* (2006.01)
*G06Q 10/08* (2012.01)
*B64F 5/60* (2017.01)

(52) U.S. Cl.
CPC ........ *G06F 17/5095* (2013.01); *B64C 39/024* (2013.01); *B64D 1/10* (2013.01); *B64F 5/00* (2013.01); *B64F 5/60* (2017.01); *G05D 1/00* (2013.01); *G06F 17/50* (2013.01); *G06Q 10/083* (2013.01); *B64C 2201/141* (2013.01)

(58) Field of Classification Search
CPC .... F15B 11/17; F15B 13/06; F15B 2211/405; F15B 2211/6652; F15B 2211/20561; F15B 2211/6346; F15B 2211/20569; F15B 2211/20576; F15B 2211/20546; F04B 1/26; F04B 49/065; E02F 9/2296; E02F 9/2235; E02F 9/2289; E02F 9/2292; B64F 5/60; G06F 17/5095; B64D 1/10
See application file for complete search history.

(56) References Cited

U.S. PATENT DOCUMENTS 6,665,594 B1 * 12/2003 Armstrong ........... G08G 5/0069
  370/315
6,873,886 B1 * 3/2005 Mullen .................... B64G 1/24
  701/2

(Continued)

OTHER PUBLICATIONS

R. DeMott, "Development of a Flexible FPGA-Based Platform for Flight Control System Research," Master's Thesis, Virginia Commonwealth University, 2010.*

(Continued)

*Primary Examiner* — Thomas G Black
*Assistant Examiner* — Peter D Nolan
(74) *Attorney, Agent, or Firm* — Kilpatrick Townsend & Stockton LLP

(57) ABSTRACT

Techniques for developing a design for a module of an unmanned device may be provided. For example, the unmanned device may comprise one or more already designed components. If a component is to be added to the unmanned device, a design of this new component may be developed. The development may include attaching a computer to the unmanned vehicle. The computer may interface with the one or more already designed components, may be configured to host features of the new component, and may interface with a design computing device. The computer and the design computing device may form a design environment within which data may be exchanged to develop the design. Upon completion of the design development, a design plan may be generated for the new component.

20 Claims, 8 Drawing Sheets

(56) References Cited

U.S. PATENT DOCUMENTS

| | | | | |
|---|---|---|---|---|
| 8,774,982 | B2* | 7/2014 | Oakley | B64C 27/08 244/17.23 |
| 9,244,147 | B1* | 1/2016 | Soundararajan | |
| 9,540,102 | B2* | 1/2017 | Levien | |
| 9,616,998 | B2* | 4/2017 | Oakley | B64C 39/024 |
| 2007/0252029 | A1* | 11/2007 | Karem | G08G 5/0021 244/1 R |
| 2012/0083945 | A1* | 4/2012 | Oakley | B64C 27/08 701/2 |
| 2014/0032034 | A1* | 1/2014 | Raptopoulos | G08G 5/0069 701/25 |
| 2014/0145026 | A1* | 5/2014 | Skjersaa | B64D 47/08 244/54 |
| 2014/0172194 | A1* | 6/2014 | Levien | G08G 5/0091 701/2 |
| 2015/0032643 | A1* | 1/2015 | Loewen | B64F 5/0045 705/305 |
| 2016/0068264 | A1* | 3/2016 | Ganesh | G08G 5/0069 701/2 |
| 2016/0189101 | A1* | 6/2016 | Kantor | G08G 5/0013 705/338 |
| 2016/0217694 | A1* | 7/2016 | Batla | G08G 5/0034 |

OTHER PUBLICATIONS

M. Assaf, R. Mootoo, S. Das, E. Petriu, V. Groza and S. Biswas, "Sensor Based Home Automation and Security System," IEEE Instrumentation and Measurement Technology Conference, May 2012.*

("Difference Between FPGA and Microcontroller," www.differencebetween.net, May 2012. [online] [accessible: https://web.archive.org/web/20120501231834/http://www.differencebetween.net/technology/difference-between-fpga-and-microcontroller/].*

W. Wong, "Dev Kits Help Alleviate Those FPGA Design Woes," Electronic Design, Aug. 2008.*

* cited by examiner

DEVELOPMENT OF AN UNMANNED AERIAL VEHICLE

BACKGROUND

More and more users are turning to network-based resources, such as electronic marketplaces, to purchase items. A network-based resource may provide a user experience unmatched by a more traditional brick and mortar store. For example, the network-based resource may offer a larger and more diverse selection of items. Further, for some of the items, there may be a number of sellers with different offers. As such, a consumer may not only have access to a rich item selection, but may also obtain items at the most convenient offers.

When a purchase is complete, a network-based resource may offer a delivery service to deliver the purchased item to a location. The delivery service may deliver the item using one of a variety of different means. For example, the item may be removed from a shelf in a warehouse, loaded into a semi-truck, transferred to a delivery van, and delivered to the location. In some cases, the item may also be transported using a plane, a train, a motorcycle, a bicycle or any combination of the foregoing.

BRIEF DESCRIPTION OF THE DRAWINGS

Various embodiments in accordance with the present disclosure will be described with reference to the drawings, in which.

DETAILED DESCRIPTION

Figure 1:
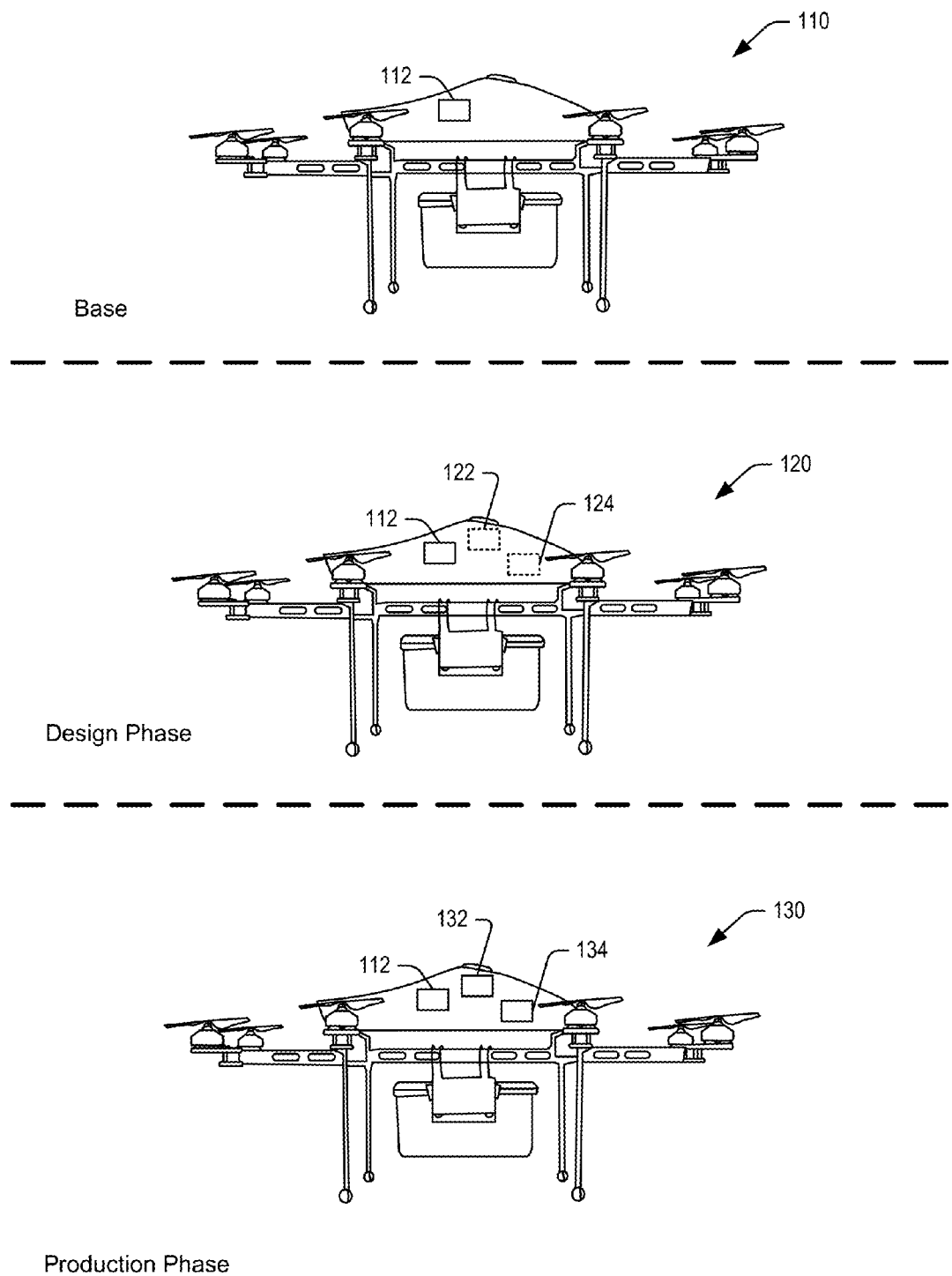
FIG. 1 illustrates an example design development of an unmanned aerial vehicle, according to embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the present disclosure are directed to, among other things, techniques relating to design development of unmanned vehicles. In the interest of clarity of explanation, example unmanned aerial vehicles are described. Nonetheless, the techniques disclosed herein may similarly apply to other types of vehicle, whether manned or unmanned and/or whether aerial or non-aerial. In particular, an existing unmanned aerial vehicle may be used for various purposes based on various existing capabilities of the vehicle. In certain situations, there may be a desire to add additional capabilities, otherwise unavailable, to the vehicle. However and as typical, adding a new capability may involve time, engineering, cost, and other types of resource necessary to design and integrate the new capability. As described herein, the techniques may allow for rapid prototyping of new components such as ones configured to implement the new capability. The rapid prototyping may involve using test components to develop a design for the new components. The test components may include a reconfigurable computing device. The reconfigurable computing device may attach to the existing unmanned aerial vehicle, interface with other existing systems of the vehicle, and interface with design and test equipment. Based on such interfaces and on the reconfigurable computing device, design data may be collected and monitored and various configurations may be developed and tested until, for example, a satisfactory design is achieved. Thereafter, a design plan may be generated for the new components and may include, for example, using special purpose computing devices. The new components may be installed and integrated in the existing unmanned aerial vehicle to provide the new capability.

To illustrate, consider an example of an electronic marketplace configured to offer items to consumers. A consumer may purchase one of the items and specify a delivery address. In turn, the electronic marketplace may support a delivery service that may include using an unmanned aerial vehicle to deliver the purchased item to the specified address. In certain situations, there may be a desire to add additional capabilities, otherwise not available, to the vehicle. For example, while airborne on a flight to deliver the item, the unmanned aerial vehicle may encounter an obstacle. As such, adding an obstacle detection and avoidance system to the unmanned aerial vehicle may be desired. To rapidly design this system, a small form factor computer and various sensors may be attached to the unmanned aerial vehicle. The sensors may be configured to sense obstacles. In comparison, the small form factor computer may be a type of a general purpose computer hosting a detection and avoidance module. This module may be configured to detect an obstacle and compute an adjustment to a flight path based on the data from the sensors. The small form factor computer may interface with an existing management module of the unmanned aerial vehicle configured to manage the flight. The small form factor computer may also wirelessly interface with ground design and test equipment. As such, a designer may test and update a design of the sensors and/or the detection and avoidance module in-real time and from the ground while the unmanned aerial vehicle is airborne. For example, the designer may monitor the sensed data, determine changes to the detection and avoidance module, upload the changes to the small form factor computer, and continue the testing and design development. Once the design is complete, a design plan for the sensors, the detection and avoidance module, and/or a special purpose computer (e.g., a field-programmable gate array—FPGA) for hosting the module may be available. These new components may then be integrated in the unmanned aerial vehicle. As such, rapid prototyping may be achieved by using a general purpose small form factor computer and by interfacing this computer with existing components of the unmanned aerial vehicle and design and test equipment.

Turning to FIG. 1, an example design development of an unmanned aerial vehicle (UAV) is shown. In particular, a UAV 110 may be a base UAV. Generally, such a vehicle may be off-the-shelf, in production, and/or already deployed in service. The UAV 110 may include various existing components, implemented in hardware and/or software, to provide a set of existing capabilities. For example, the UAV 110 may include a management system 112. This system may be configured to allow an unmanned operation of the UAV 110. For example, the management system 112 may be configured to receive a set of coordinates associated with a flight path (e.g., source location, destination location, and/or flight path) and to manage other components of the UAV 110 (e.g., a propulsion system) to conduct the flight.

However, the UAV 110, in its existing form, may lack a certain capability. As such, there may be a desire to add this new capability to the UAV 110. Example new capabilities include obstacle detection and avoidance, image capture of certain ground objects, coordination with other UAVs, and/or other flight-related operations and maneuvers. Accordingly, new components may be designed and/or integrated with the existing components of the UAV 110 to provide the new capability. To do so, a design phase 102 may be followed.

As illustrated in FIG. 1, in the design phase 102, the UAV 110 may be referred to as a UAV 120. In particular, in this phase, rapid prototyping of the new components may be achieved. For example, a small form factor computer 122 may be attached to the UAV 120. This small form factor computer 122 may include a general purpose computer having a physical size, computing performance, and a power consumption proper to fit within the UAV 120. For example, the physical dimensions of the small form factor computer 122 may be small enough to avoid changes or reconfiguration of the management system 112 to properly manage the UAV 120's flights, thereby reducing and avoiding impacts to existing components of the UAV 120. Further, the small form factor computer 122 may interface with the existing components of the UAV 110, such as with the management system 112. By using a general purpose computer, the small form factor computer 122 may host a new module associated with the new capability and may allow a design of the new module to be tested, reconfigured, and updated until completion. For example, to design for an obstacle detection and avoidance capability, the small form factor computer 122 may host an obstacle detection and avoidance module, where this module may be configured to implement an algorithm for detecting an object and adjusting a flight path. As further illustrated in FIG. 3, the small form factor computer 122 may also interface with design and test equipment on, for example, the ground. This interface may allow test-related data to be collected and changes to the new module to be received in, for example, real-time.

In addition, and based on the new capability, a new component 124 may be attached to the UAV 120 and may interface with the small form factor computer 122 and/or some of the existing components. Continuing with the previous example, if the UAV 110 does not include sensors usable for detecting obstacles, such sensors may be attached to the UAV 120 as the new component 124. In turn, sensed data may be sent from the new component 124 to the small form factor 122 for processing at the new module and/or for transmission to the design and test equipment.

As such, during the design phase 102, the small form factor computer and, as needed, the new component 124 may be used to develop a design for the components of the new capability. Given that the small form factor computer 122 may include a general purpose computer that may be easily reconfigured and that may provide various computing capabilities, rapid prototyping of the components may be achieved. Once the design is complete, a production and service phase 104 may be followed.

As illustrated in FIG. 1, in the production and service phase 104, the UAV 110 may be referred to as a UAV 130. In particular, in this phase, a production component 132 (and, as needed, a production component 134) may be added to the UAV 130. In other words, while in the design phase 102, the small form factor computer 122 and new component 124 may be temporarily added to the UAV 120 for the purpose of design development. In the production and service phase 104, the production components 132 and 134 may permanently replace these temporary components (e.g., 122, 124) and allow the UAV 130 to provide the new capability in service. These production components 132 and 134 may be designed, manufactured, installed, and/or integrated in the UAV 130 based on the resulting design from the design phase 102 to provide the new capability. For example, the production component 132 may be a special purpose computer designed and optimized to host the new module within the UAV 130. Similarly, the production component 134 may be a production version of the new component 124. To illustrate and continuing with the previous example, the production component 132 may include an FPGA designed to run the detection and avoidance module, whereas the production component 134 may include a production version of the sensors.

Figure 2:
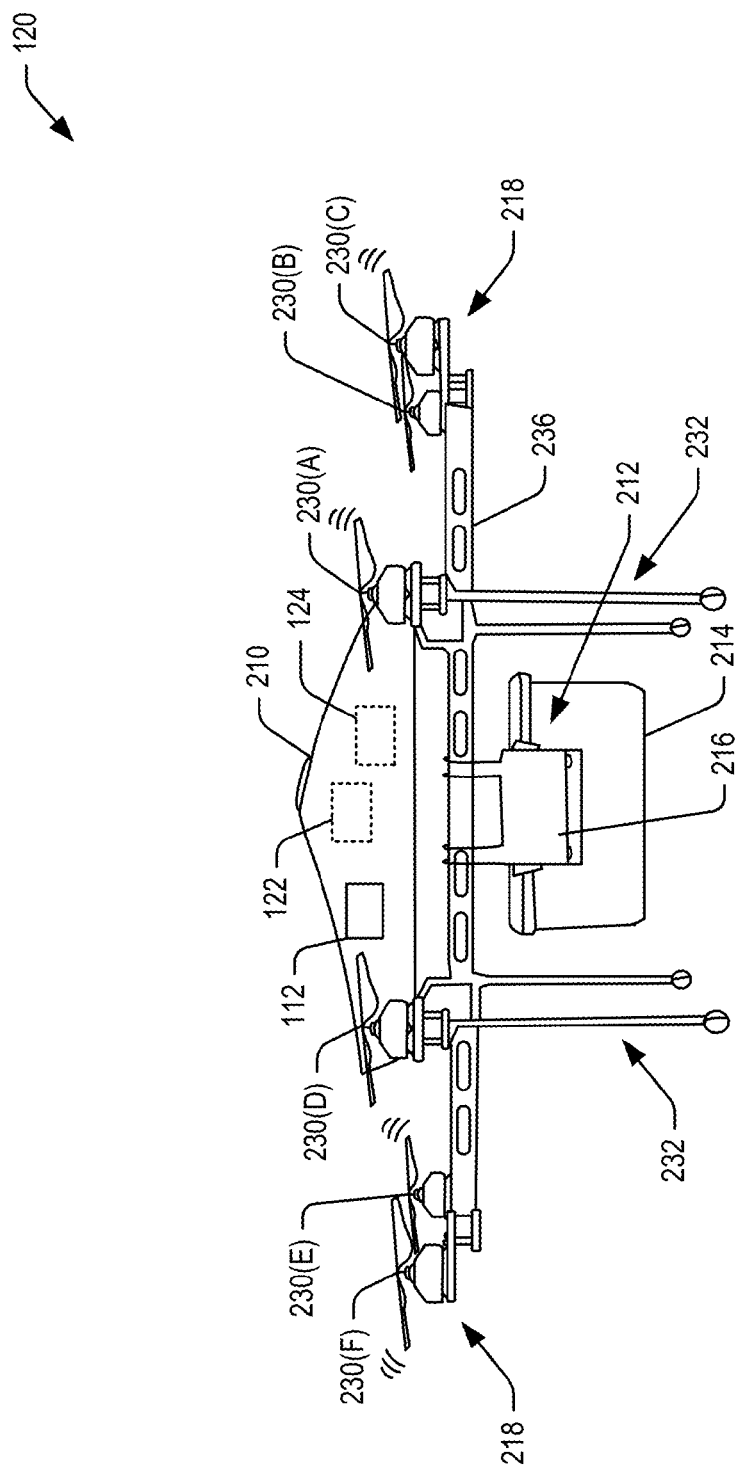
FIG. 2 illustrates an example unmanned aerial vehicle having components under design development, according to embodiments.

Turning next to FIG. 2, example components of the UAV 120 are shown. The UAV 120 may be designed in accordance with commercial aviation standards and may include multiple redundancies to ensure reliability. In particular, the UAV may include multiple components. Generally and with the exception of the small form factor computer 122 and the new component 124, the remaining components of the UAV 120 may have been fully designed and operational. These components may include, for example, the management system 112, a retaining system 212, a propulsion system 218, a landing structure 222, and associated sub-components.

As illustrated in FIG. 2, the UAV 120 may include a plurality of systems or subsystems operating under the control of, or at least partly under the control of, the management system 112. The management system 112 may include a management module and an onboard computer running the management module for autonomously or semi-autonomously controlling and managing the UAV 120 and, in some examples, for enabling remote control by a pilot. Portions of the management system 112, including the onboard computer, may be housed under a top cover 210. As used herein, the management system 112 may include a power supply and assemblies (e.g., rechargeable battery, liquid fuel, and other power supplies) (not shown), one or more communications links and antennas (e.g., modem, radio, network, cellular, satellite, and other links for receiving and/or transmitting information) (not shown).

The UAV 120 may also include the retaining system 212. The retaining system 212 may be configured to retain a payload 214. In some examples, the retaining system 212 may retain the payload 214 using friction, vacuum suction, opposing arms, magnets, and other retaining methods. As illustrated in FIG. 2, the retaining system 212 may include two opposing arms 216 (only one is illustrated) configured to retain the payload 214. The management system 112 may be configured to control at least a portion of the retaining system 212. In some examples, the retaining system 212 may be configured to release the payload 214 in one of a variety of ways. For example, the retaining system 212 (or other system of the UAV 120) may be configured to release the payload 214 with a winch and spool system, by the retaining system 212 releasing the payload, or other methods of releasing the payload. In some examples, the retaining system 212 may operate semi-autonomously or autonomously.

In FIG. 2, the payload 214 is illustrated as a delivery box. In some examples, the delivery box may include one or more packages or items intended for delivery to a recipient using the techniques described herein. The payload 214, whether as a delivery box or otherwise, may be configured for delivery using a variety of different methods. For example, the payload 214 may include a parachute that opens and slows the payload's 214 descent as it falls to its delivery location. In some examples, the payload 214 may include padding surrounding its package to reduce the impact of a drop from the UAV 120 above the ground. The UAV 120 may also deliver the payload 214 by fully landing on the ground and releasing the retaining system 212.

Further, the UAV 120 may include the propulsion system 218. In some examples, the propulsion system 218 may include rotary blades or otherwise be a propeller-based system. As illustrated in FIG. 2, the propulsion system 218 may include a plurality of propulsion devices, a few of which, 230(A)-230(F), are shown in this view. Each propulsion device may include a propeller, a motor, wiring, a balance system, a control mechanism, and other features to enable flight. In some examples, the propulsion system 218 may operate at least partially under the control of the management system 112. In some examples, the propulsion system 218 may be configured to self-adjust without receiving instructions from the management system 112. Thus, the propulsion system 218 may operate semi-autonomously or autonomously. The propulsion system 218 may enable multi-directional flight of the UAV 120 (e.g., by adjusting each propulsion device 230 individually). In this manner, the UAV 120 may be configured to respond to human interaction by adjusting the features of the propulsion system 218.

The UAV 120 may also include the landing structure 222. The landing structure 222 may be adequately rigid to support the UAV 120 and the payload 214. The landing structure 222 may include a plurality of elongated legs which may enable the UAV 120 to land on and take off from a variety of different surfaces. The plurality of systems, subsystems, and structures of the UAV 120 may be connected via frame 226. The frame 226 may be constructed of a rigid material and be capable of receiving via different connections the variety of systems, subsystems, and structures. For example, the landing structure 222 may be disposed below the frame 226 and, in some examples, may be formed from the same material and/or same piece of material as the frame 226. The propulsion system 218 may be disposed radially around a perimeter of the frame 226 or otherwise distributed around the frame 226. In some examples, the frame 226 may include or be attached to one or more fixed wings.

In addition to these already designed and operational components, the UAV 120 may include the small form factor computer 122 and the new component 124. These two components may be attached to the UAV using various mechanisms. For example, the small form factor computer 122 and the new component 124 may be housed under the top cover 210. In another example, friction, vacuum suction, magnets, hook and loop fasteners, straps, and/or other retaining methods may be used to secure, at least temporarily, the small form factor computer 122 and the new component 124 to the UAV 120.

Turning to the small form factor computer 122, that computer may include a general purpose computer of a particular size, computing performance, and power consumption to fit within the UAV 120. For example, the general purpose computer may include a memory configured to store computer-readable instructions and a processor, such as a central processing unit, configured to access the memory and execute the computer-readable instructions. These two computer components may be implemented on a motherboard having a small dimension, such as 4 inches×4 inches. In a way, the general purpose computer may be a type of a personal computer. However, a screen and other input/output (I/O) peripherals may not be included to keep, for example, the form factor as small as possible. Instead, screen and I/O forwarding techniques may be implemented to remotely interact with a screen and I/O peripherals over a network. The general purpose computer may also include I/O ports and interfaces, such as a modem or a wireless interface, to enable remote access over the network as further illustrated in FIG. 3. Further, the general purpose computer may use various power supplies. For example, if a 10 Volt DC power supply is available at the UAV 120, the general purpose computer may use this supply. Otherwise, a power converter to supply power from the UAV 120 or a rechargeable battery may be also attached to the UAV 120. In an example, the general purpose computer may include a version of a next unit of computing (NUC) available from the Intel Corporation. The interface of the general purpose computer with the management system 112, such as with the onboard computer of the management system 112, may include a serial connection using, for example, serial ports such as RS232 ports. The interface of the general purpose computer with the new component 124 may be configured to receive data from the new component and may include, for example, analog to digital converters, a simple sensor interface (SSI), a wireless interface, and/or cables and connectors.

The new component 124 may be a component configured to support the new capability but that may lack computing power. For example, the new component 124 may be a sensor for collecting a particular type of data and for providing this data to the small form factor computer 122 for further processing. The new component 124 may include one or more light sensors (e.g., imaging device, depth sensor, visible light camera, infrared camera, RGB camera, depth aware camera, infrared laser projector, ultraviolet sensitive cameras, scanning sensor, light filters and any combination of the foregoing), one or more auditory sensors (e.g., microphone, noise filters, and other sensors for capturing sound), one or more output devices (e.g., microphone, speaker, laser projector, light projector, and other devices for outputting information), one or more navigation devices and antennas (e.g., global positioning system (GPS), inertial navigation system (INS), range finder, Radio Detection And Ranging (RADAR), radio-frequency identification (RFID) capability), and/or interfaces capable of speech interpretation and recognition. In an example, the small form factor computer 122 and the new component 124 may be partially or fully integrated.

The small form factor computer 122, the new component 124, and the interface between the two and with the management system 112 may allow for rapid prototyping. In particular, if a new capability is desired (e.g., obstacle detection and avoidance), an associated new component 124

(e.g., a number of light sensors and navigation devices and antennas) and the small form factor computer 122 may be attached to the UAV 120. A computing module implementing features of the new capabilities (e.g., an obstacle detection and avoidance algorithm implemented as computer-readable instructions) may be remotely deployed from design and test equipment over the network to the small form factor computer 122 for hosting and testing. In turn, the small form factor computer 122 may interface with the new component 124 to collect the data, such that the new module may process the collected data and determine an adjustment. The small form factor computer 122 may send that adjustment to the management system 112. Further, the small form factor computer 122 may transmit the collected data and/or information about the adjustment over the network to the design and test equipment for monitoring and analyzing. If changes to the new module result, these changes may be transmitted from the design and test equipment to the small form factor computer 122 to update the new module accordingly.

Figure 3:
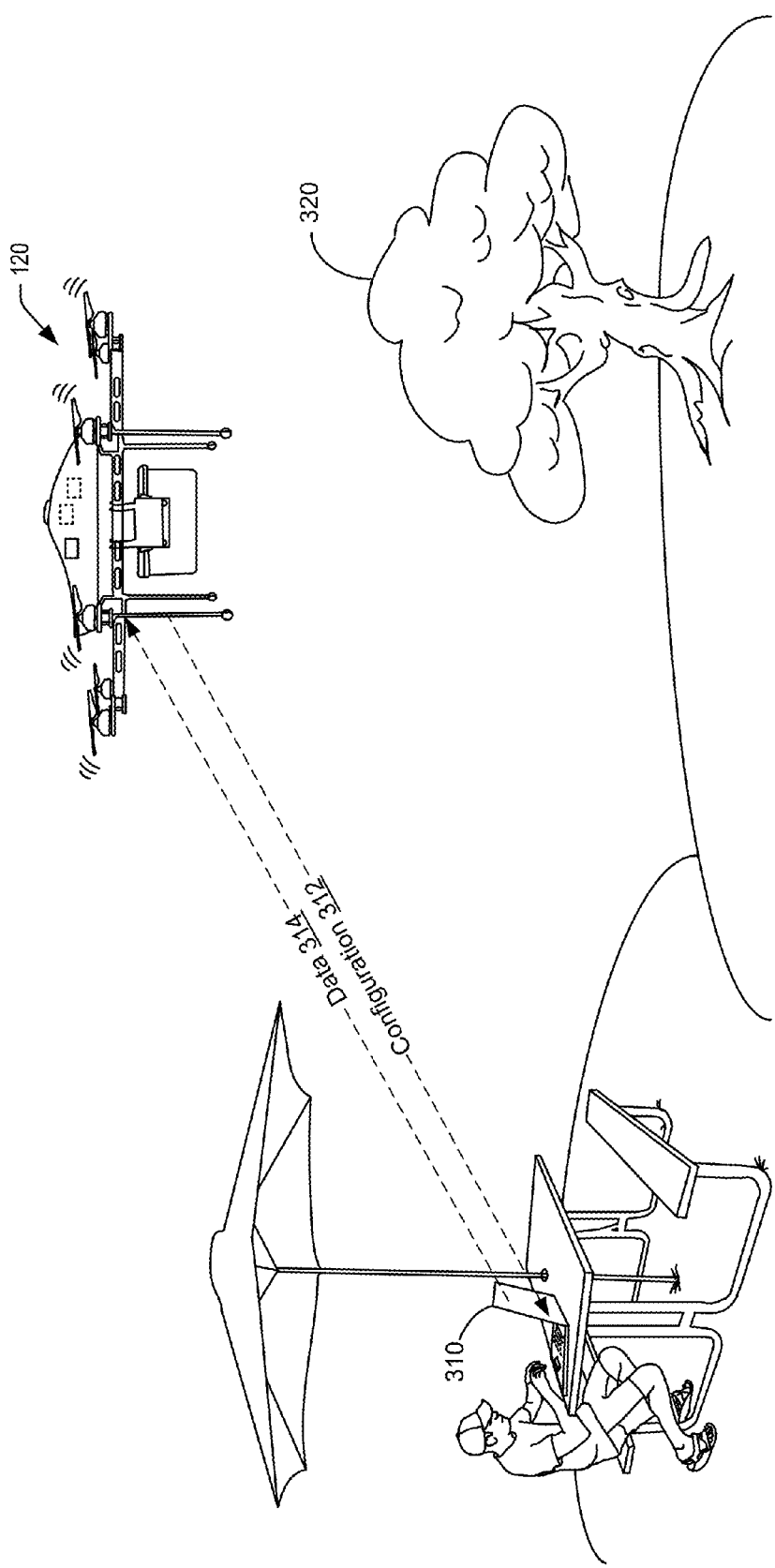
FIG. 3 illustrates an example test environment to test an unmanned aerial vehicle, according to embodiments.

Turning to FIG. 3, an example test environment configured to facilitate the testing and design development of new components of a UAV in a design phase is shown. As illustrated in the figure, design and test equipment 310 may be configured to interact with the UAV 120 to test and develop a design for a new capability. In an illustrated example, the new capability may include detection and avoidance of an obstacle 320.

The design and test equipment 310 may be a computing device. This computing device may be a device on a network of devices, such as ones forming a design and test environment, and may thus be a computing node within that network. In that case, the computing node may interface with other computing nodes of the design and test environment to test and develop the design for the new capability. In an example, the design and test equipment 310 may be any suitable computing device such as, but not limited to, a mobile phone, a smart phone, a personal digital assistant (PDA), a laptop computer, a thin-client device, a tablet PC, a desktop computer, a set-top box, or other computing device. In this example, a designer may operate the design and test equipment 310 to test the UAV 120. For instance, the designer may use the design and test equipment 310 to monitor test parameters, update the small form factor computer 122, and perform other design development operations. In another example, the design and test equipment 310 may be a server or any other suitable computing device configured to store test-related information. In this example, the UAV 120 may be tested autonomously. For instance, the design and test equipment 310 may store a test script that, when accessed by the UAV 120, may cause the UAV 120 to perform a test and transmit information related thereto. In yet another example, the design and test equipment 310 may be any computing node configured to provide the UAV 120 with access to the design and test environment. In this example, the UAV 120 may become part of the test and design environment and may have access to different resources of this environment. This access may be controlled using an access control list (ACL) and may include, for instance, privileged access to files, directories, systems, and other resources. In this example, the UAV 120 may be considered as one of the computing nodes of the test and design environment. An example of the design and test equipment 310 is further illustrated in FIG. 5.

The design and test equipment 310 may also interface with the UAV 120, in particular with the small form factor computer 122. This interface may allow direct, point-to-point communication and may include, for example, a local area network (LAN). In another example, the interface may include a public network, such as the Internet. In this case, the communication between the design and test equipment 310 and the UAV 120 (e.g., the small form factor computer 122) may be carried over a virtual private network (VPN). Further, the design and test equipment 310 may implement screen forwarding and remote access techniques to receive and present data collected by, for example, the small form factor computer 122 and/or to access the small form factor computer 122.

Further, the design and test equipment 310, alone or in combination with other computing nodes, may provide an environment configured to test and develop the design for the new capability. This environment may include an integrated development environment (IDE) that may provide a software development kit (SDK). A corresponding user interface may be available at the design and test equipment 310 to allow a user, such as a designer, to write and edit code, perform various debugging and compiling operations, monitor and analyze data, update computer-aided design (CAD) drawings, and other design development operations.

As illustrated in FIG. 3, the design and test equipment 310 may be configured to send a configuration file 312 to the small form factor computer 122. Further, the design and test equipment 310 may receive data 314 from the small form factor computer 122. This exchange of information may be remotely performed (e.g., over a network) in, for example, real-time or substantially real-time. In another example, the information exchange may be non-real time. For instance, once testing is complete, data from the small form factor computer 120 may be downloaded, remotely or otherwise, to the design and test equipment 310.

The configuration file 312 may include code (e.g., computer readable instructions) configured to implement features of the new capability. This code may be developed using the SDK and may represent the new module for implementing the features of the new capability or updates to the new module. Once received, the small form factor computer 122 may store the configuration file 312 and execute the code to implement the new module. In another example, the execution of the code may be distributed between the design and test equipment 310 and the small form factor computer 122 such that some features of the new capability may be implemented at the UAV 120, while the remaining ones may be implemented at the design and test equipment 310. In comparison, the data 314 may include data received by the small form factor computer 122 from the new component 124. In an example, the small form factor computer 122 may provide this data in a raw format to the design and test equipment 310 for further processing. In another example, the small form factor computer 122 may partially or fully process the data and provide information resulting from the processing to the design and test equipment 310 as the data 314.

As such, by interfacing with the design and test equipment 310, and by interfacing with the management system 112 and the new component 124, the small form factor computer 112 may allow the testing and development of the design in, for example, real-time. To illustrate, if a new obstacle detection and avoidance capability is desired, a configuration file 312 including code for an obstacle detection and avoidance module may be generated at the design and test equipment and sent to the small form factor computer 122. In turn, and during a flight test over the obstacle 320, the small form factor computer 122 may implement this module and accordingly interface with the new component 124 (e.g., sensors, navigation systems, and antennas) and the management system 112. Also, during the flight test, the small form factor computer 122 may transmit the sensed data and information about derived flight path adjustments to the design and test equipment 310. This may allow the user to monitor in real-time the data and the adjustments outputted by the obstacle detection and avoidance module. If updates to the obstacle detection and avoidance module are needed, the user may further use the design and test equipment 310 to generate and send these updates to the small form factor computer 122. This process may be iteratively repeated until completing of the flight test. At that point, a design of the obstacle detection and avoidance may be complete.

Figure 4:
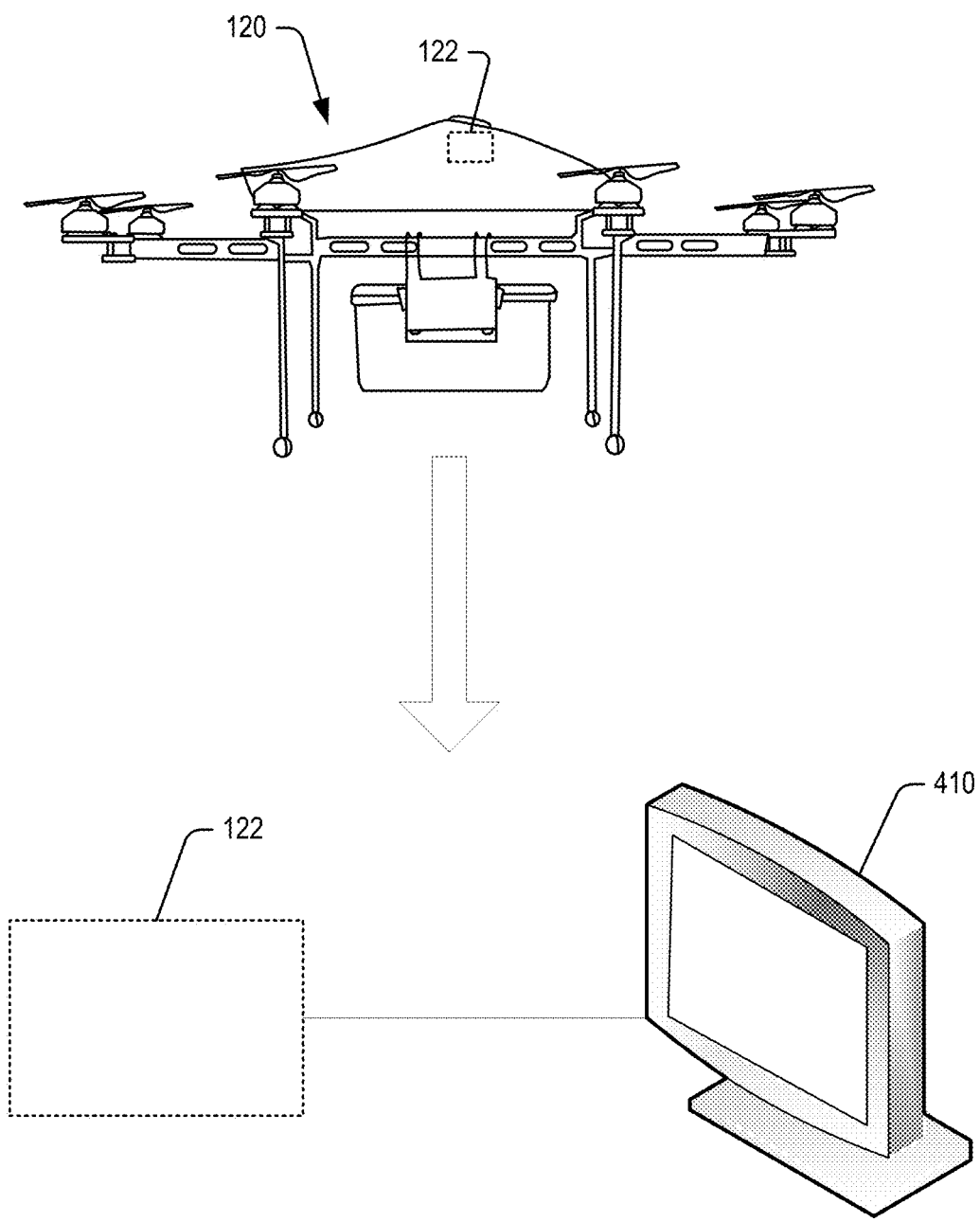
FIG. 4 illustrates an example multi-purpose use of a computing system associated with under design components of an unmanned aerial vehicle, according to embodiments.

Turning to FIG. 4, example uses of the small form factor computer 122 are shown. In particular, based on including a general purpose computer, the small form factor computer 122 may be configured to perform multiple operations, some of which may be related to and others that may be independent of the test and design of the UAV 120. For example, when a flight test is complete, the small form factor computer 122 may be detached from the UAV 120 and connected directly to a computing node of the design and test environment described in connection with FIG. 3. As such, the small form factor computer 122 may become a computing node within that environment, in communication with other computing nodes. In this example, and similarly to the test and design capability described in connection with FIG. 3, test data, configuration files, code, modules, and other test and design-related data may be exchanged between the small form factor computer 122 and the other computing nodes.

In another example, various I/O peripherals, such as a screen 410, a keyboard, a mouse, and/or other I/O peripherals may be connected to the small form factor computer 122. As such, the small form factor computer 122 may be configured and used as a personal computer (PC). For instance, a user may operate this PC to perform tasks that may be independent of the test and design, such as sending emails, surfing the Internet, accessing social networks, and/or other personal and work related tasks.

Figure 5:
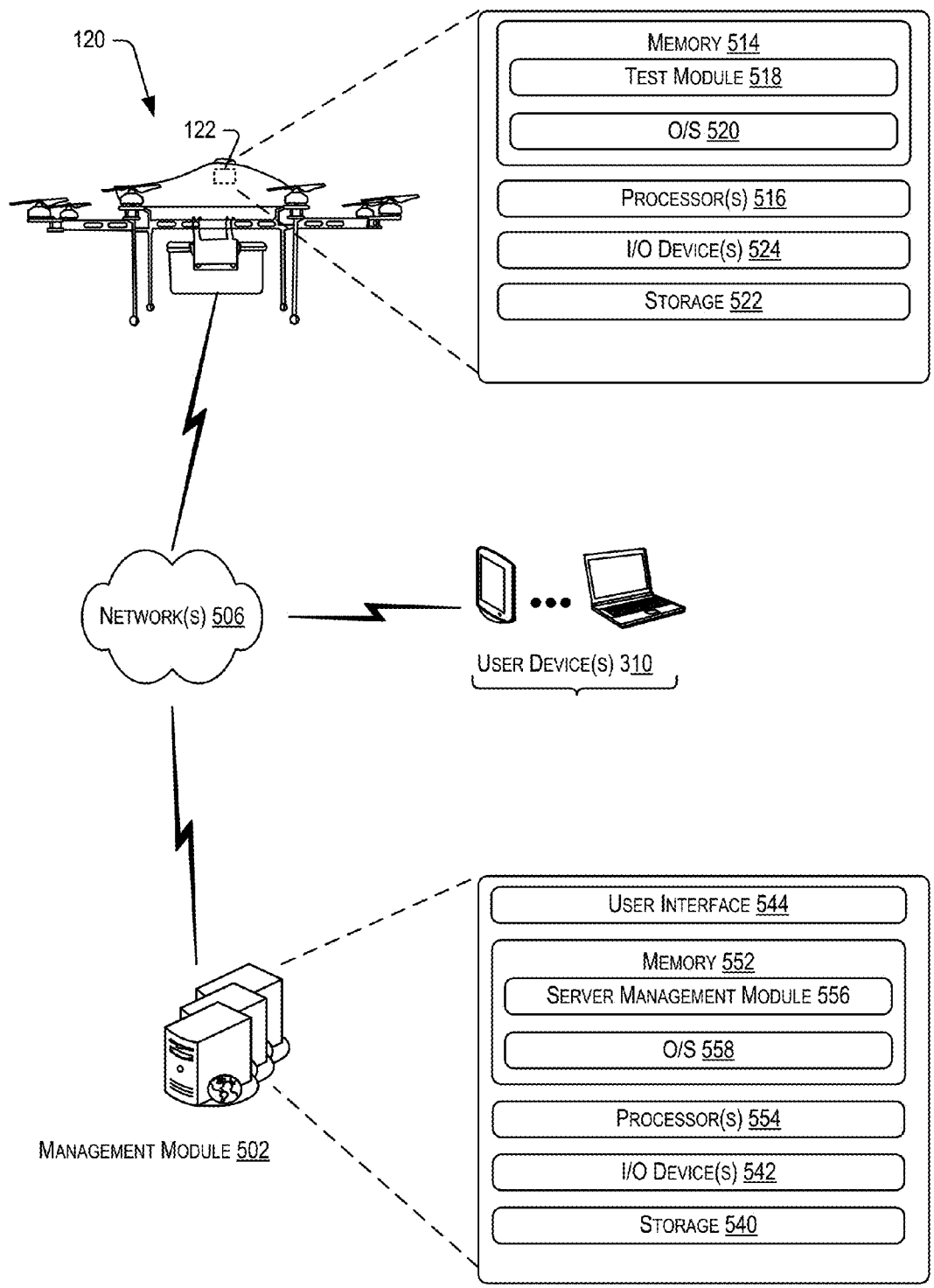
FIG. 5 illustrates an example computing environment associated with under design components of an unmanned aerial vehicle, according to embodiments.

Turning next to FIG. 5, an example design and test environment for developing a design associated with new capabilities of the UAV 120 is shown. The environment may include, among other things, the small form factor computer 122, the design and test equipment 310, and a network 506. In this manner, the small form factor computer 122 and the design and test equipment may be in communication over the network 506 to exchange data and configuration files as described in connection with FIG. 3.

The network 506 may include any one or a combination of many different types of networks, such as wireless networks, cable networks, cellular networks, radio networks, an intranet, the Internet, and other private and/or public networks. Thus, the small form factor computer 122 may be configured to provide access to the design and test equipment 310 prior to, during, and after completion of a flight test.

Turning now to the details of the small form factor computer 122, this computer may include at least one memory 514 and one or more processing units (or processor(s)) 516. The processor(s) 516 may be implemented as appropriate in hardware, computer-executable instructions, software, firmware, or combinations thereof. Computer-executable instruction, software or firmware implementations of the processor(s) 516 may include computer-executable or machine-executable instructions written in any suitable programming language to perform the various functions described. The memory 514 may include more than one memory and may be distributed throughout the small form factor computer 122. The memory 514 may store program instructions (e.g., various test modules 518A-N, which may be referred to herein collectively as a test module 518) that are loadable and executable on the processor(s) 516, as well as data generated during the execution of these programs. Depending on the configuration and type of memory including the test module 518, the memory 514 may be volatile (such as random access memory (RAM)) and/or non-volatile (such as read-only memory (ROM), flash memory, or other memory). The test module 518 may also include additional removable storage and/or non-removable storage including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 514 may include multiple different types of memory, such as static random access memory (SRAM), dynamic random access memory (DRAM), or ROM. Turning to the contents of the memory 514 in more detail, the memory 514 may include an operating system 520 and one or more application programs, modules or services for implementing the features disclosed herein including at least the test module 518. The test module 518 may include computer-readable instructions for performing a number of operations related to a design under development for a new capability. These operations and/or the test module 518 may be defined in a configuration file(s) received from the design and test equipment 310 over the network 506. Each of the test modules 518A-N may correspond to a new capability. Alternatively, some of the test modules 518A-N may correspond to different versions of a test module for a same capability. In this case, the small form factor computer 122 may implement a full or a distributed revision source code management system, such as GIT of Software Freedom Conservancy, Inc. The new capability may be event-based. For example, the new capability may include determining a change to a flight of the UAV 112 based on a detected event (e.g., detected by the new component 124). The new capability may also include causing the management system 112 of the UAV 120 to accordingly change the flight. As such, the test module 518 may represent an event module configured to determine a change to a flight based at least in part on a detected event. This determination may take into account a weight of the small form factor computer 122 and/or the new component 124. In an example, accounting for the weight may be relative to a potential (e.g., estimated) weight of production versions of the small form factor computer 122 and/or the new component 124.

In some examples, the small form factor computer 122 may also include additional storage 522, which may include removable storage and/or non-removable storage. The additional storage 522 may include, but is not limited to, magnetic storage, optical disks, and/or tape storage. The disk drives and their associated computer-readable media may provide non-volatile storage of computer-readable instructions, data structures, program modules, and other data for the computing devices. Data received by the small form factor computer 122 from the new component 124 and/or the management system 112 may be stored in the additional storage 522 and/or the memory 514.

The memory 514 and the additional storage 522, both removable and non-removable, are examples of computer-readable storage media. For example, computer-readable storage media may include volatile or non-volatile, removable, or non-removable media implemented in any suitable method or technology for storage of information such as computer-readable instructions, data structures, program modules, or other data. As used herein, modules may refer to programming modules executed by computing systems (e.g., processors). The modules of the small form factor computer 122 may include one or more components. The small form factor computer 122 may also include I/O device(s) and/or ports 524, such as for enabling connection with a keyboard, a mouse, a pen, a voice input device, a touch input device, a display, speakers, a printer, or other I/O device. The I/O device(s) 524 may enable communication with the other systems and components of the UAV 120 (e.g., the management system 112 and the new component 124) and with the design and test equipment 310.

Turning now to the details of the design and test equipment 310, this equipment may be used by a user (e.g., a designer and/or a tester) for interacting with the UAV 120 and, in particular, the small form factor computer 122 and the test module 518. The design and test equipment 310 may therefore include a memory, a processor, a user-interface, a web-service application, and any other suitable feature to enable communication with the features of architecture 300. The web service application may be in the form of a web browser, an application programming interface (API), virtual computing instance, or other suitable application. In some examples, the user may use the design and test equipment 310 to monitor data received by the small form factor computer 122 (e.g., data stored in the memory 514 and/or the additional storage 522), access one of or a version of the test module 518, upload a new version of a change to the test module 518, and/or other design and test related tasks.

The design and test equipment 310 may include one or more computing devices, perhaps arranged in a cluster of servers or as a server farm, and may host web service applications and/or other applications within the context of a design and test environment. The design and test equipment 310 may include at least one memory 532 and one or more processing units (or processor(s)) 534. The processor(s) 534 may be implemented as appropriate in hardware, computer-executable instructions, software, firmware, or combinations thereof. Computer-executable instruction, software or firmware implementations of the processor(s) 534 may include computer-executable or machine-executable instructions written in any suitable programming language to perform the various functions described. The memory 532 may include more than one memory and may be distributed throughout the design and test equipment 310. The memory 532 may store program instructions (e.g., a design and test module 536) that are loadable and executable on the processor(s) 534, as well as data generated during the execution of these programs. Depending on the configuration and type of memory including the design and test module 536, the memory 532 may be volatile (such as random access memory (RAM)) and/or non-volatile (such as read-only memory (ROM), flash memory, or other memory). The design and test equipment 310 may also include additional removable storage and/or non-removable storage including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 532 may include multiple different types of memory, such as static random access memory (SRAM), dynamic random access memory (DRAM), or ROM. Turning to the contents of the memory 532 in more detail, the memory 532 may include an operating system 538 and one or more application programs, modules or services for implementing the features disclosed herein including at least the design and test module 536. The design and test module 536, in some examples, may be part of an integrated design environment and may provide SDK capabilities. For example, the design and test module 536 may allow a user to generate and update configuration files including code for the test module 518 and to monitor and analyze data. In this way, when the small form factor computer 122 is in network communication with the design and test equipment 310, the small form factor computer 122 may receive at least some instructions from the design and test equipment 310 as the design and test module 536 is executed by the processors 534. In some examples, the UAV 304 executes the test module 518 to operate independent of the design and test equipment 310. Further, the design and test equipment may implement a full or a distributed revision source code management system, such as GIT of Software Freedom Conservancy, Inc. in association with different versions of the test module 518.

In some examples, the design and test equipment 310 may also include additional storage 550, which may include removable storage and/or non-removable storage. The additional storage 550 may include, but is not limited to, magnetic storage, optical disks, and/or tape storage. The disk drives and their associated computer-readable media may provide non-volatile storage of computer-readable instructions, data structures, program modules, and other data for the computing devices. Data received by the design and test equipment 310 from the small form factor computer 122 and/or other computing nodes with the design and test environment may be stored in the additional storage 550 and/or the memory 532.

The memory 532 and the additional storage 550, both removable and non-removable, are examples of computer-readable storage media. For example, computer-readable storage media may include volatile or non-volatile, removable, or non-removable media implemented in any suitable method or technology for storage of information such as computer-readable instructions, data structures, program modules, or other data. The program modules of the design and test equipment 310 may include one or more components. The design and test equipment 310 may also include input/output (I/O) device(s) and/or ports 552, such as for enabling connection with a keyboard, a mouse, a pen, a voice input device, a touch input device, a display, speakers, a printer, or other I/O device.

In some examples, the design and test equipment 310 may also include a user interface 544. The user interface 544 may be utilized by the user to access portions of the design and test equipment 310. In some examples, the user interface 544 may include a graphical user interface, web-based applications, programmatic interfaces such as application programming interfaces (APIs), or other user interface configurations. The user interface 544 may be driven by the design and test module 536 such that test data and associated analysis may be displayed to the user and such that changes or new test modules or configuration files may be written, compiled, debugged, and/or transmitted to the small form factor computer 122. Further, the small form factor computer 122 and the design and test equipment 310 may implement screen forwarding and/or remote access techniques. This may allow the user to operate the user interface 544 and, accordingly, access the small form factor or test data remotely.

Figure 6:
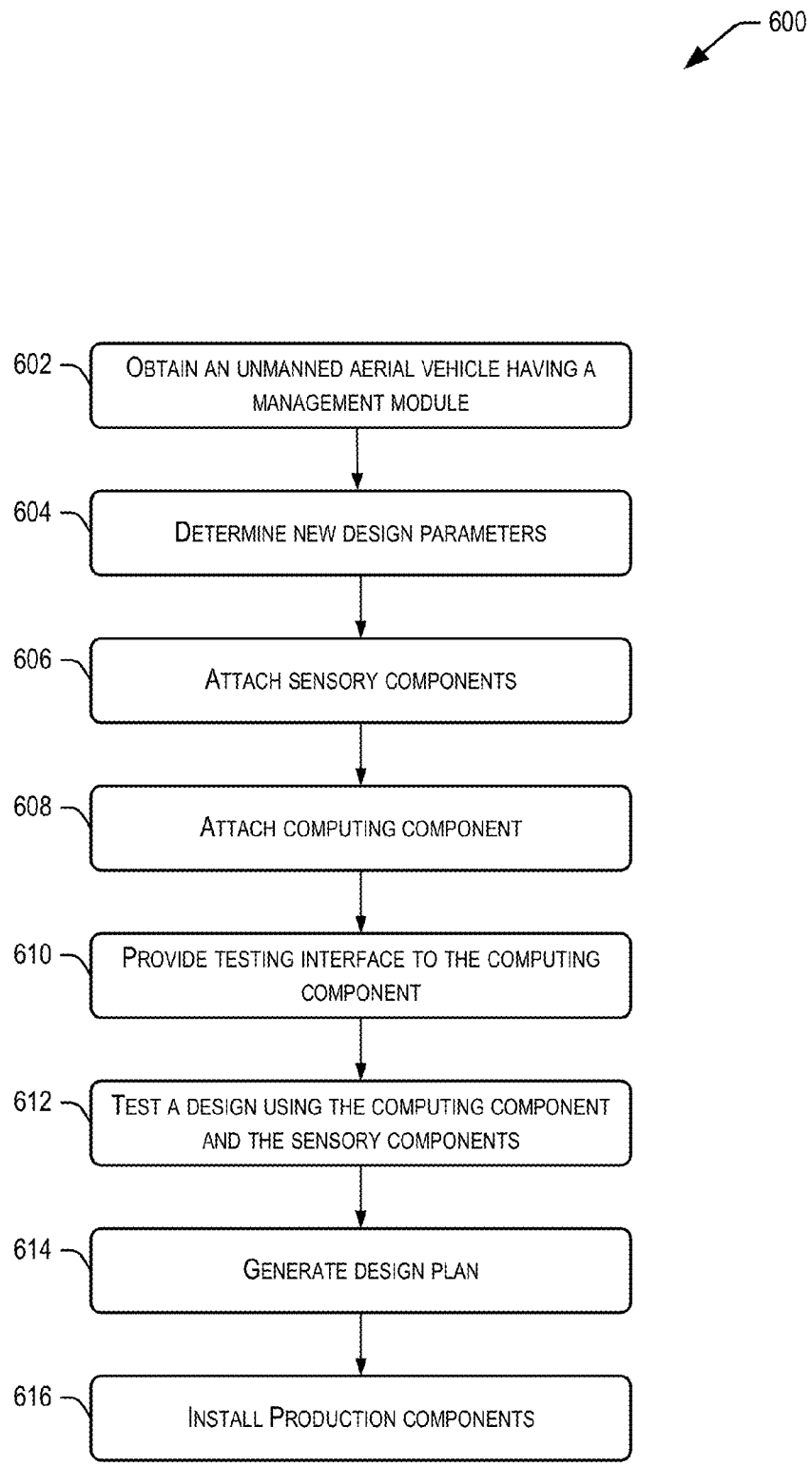
FIG. 6 illustrates an example flow for developing a design associated with components of an unmanned aerial vehicle, according to embodiments.
Figure 7:
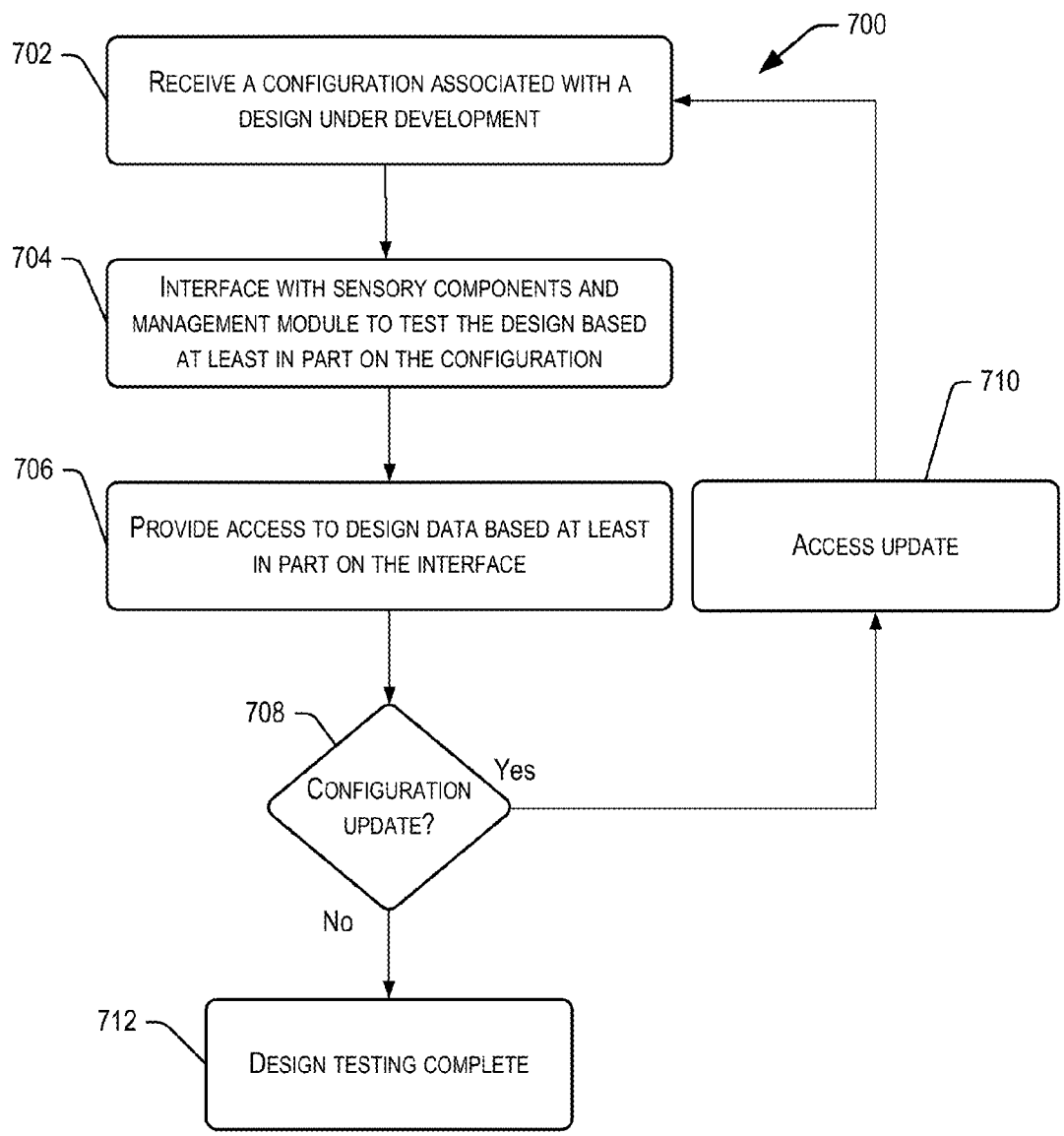
FIG. 7 illustrates an example flow for developing a design associated with components of an unmanned aerial vehicle, according to embodiments.

Turning to FIGS. 6-7, those figures illustrate example flows for developing a design for a new capability of a UAV. FIG. 6 illustrates an example flow 600 that may include a design phase and a production and service phase. In comparison, FIG. 7 illustrates an example flow 700 for using a computer attached to the UAV, such as the small form factor computer 122, in the design phase. Some of the operations of the example flow 600 of FIG. 6 may be further embodied in operations of the example flow 700 of FIG. 7. Thus, some operations may be similar. Such similarities are not repeated herein in the interest of clarity of explanation.

Further, in the illustrative operations, some of the operations or functions may be embodied in, and fully or partially automated by, modules executed by one or more processors. For example, the computer attached to the UAV may be configured to collect data and implement a test module. In comparison, design and test equipment, in communication with the computer, may be configured to provide a user interface and a design and test module, and may be a computing node within a design and test environment. Nevertheless, other or a combination of other computing devices and modules may be additionally or alternatively used. Also, while the operations are illustrated in a particular order, it should be understood that no particular order is necessary and that one or more operations may be omitted, skipped, and/or reordered.

The example flow 600 of FIG. 6 may start at operation 602, where a UAV having a set of components may be obtained. An example of this UAV may include the UAV 120 described in connection with FIG. 1. In particular, the set of components may be existing systems, structures, and other types of components that may provide a number of existing capabilities. For example, the UAV may have a frame, a propulsion system, a retaining system, and a management system as described in connection with FIG. 2. Obtaining the UAV may include purchasing a UAV of the shelf or retrieving a UAV from an existing fleet.

At operation 604, a new capability to be added to the UAV may be determined. For example, an analysis and/or a comparison of the existing capabilities to a new mission, maneuver, task, and/or operation of the UAV may indicate that the UAV lacks the new capability. To illustrate, if the UAV is capable of retaining and delivering packages purchased from an electronic marketplace but incapable of autonomously avoiding obstacles along the delivery flight, the new capability may include obstacle detection and avoidance.

At operation 606, a new component based on the new capability may be attached to the UAV. For example, if providing the new capability dictates a new component, such as a new sensor, that component may be attached to the UAV. Otherwise, an existing component capable of supporting the new capability may be used. In either case, providing the new capability may further need computing resources, including hardware and software as further described at operation 606. Attaching the new component may involve installing the new component in the UAV, wiring the new component for data and power connections to other existing components of the UAV, and securely retaining, at least temporarily, the new component and the wiring.

At operation 608, a new computer may be attached to the UAV. The new computer may include a small form factor computer having proper computing power, size, and power consumption to fit within the UAV and having I/O ports and devices to interface with other computers. In an example, the small form factor computer may be a type of a general purpose computer that may be configured and reconfigured for various operations. These may include interfacing with the new component, existing components, and design and test equipment, receiving and transmitting data, receiving a configuration file or an update to a configuration file, running a test module based on the configuration file, and/or other design and test related operations. Attaching the computer may involve installing the computer in the UAV, wiring the computer for data and power connections to other existing components of the UAV and the new component, and securely retaining, at least temporarily, the computer and the wiring.

At operation 610, an interface may be provided to the computer. For example, the design and test computer may include a user interface for remotely accessing the computer. The user interface may be driven by a design and test module running at the design and test equipment. Providing the interface may involve using screen forwarding and/or remote access techniques. This may enable data received from the computer to be presented and monitored at the design and test computer. The interface may also enable uploading changes to the test module implemented on the computer.

At operation 612, a design for the new capability may be developed based on the computer and the new component. In other words, by using the computer and the new component, rapid prototyping may be achieved. The design may include a design plan for a production version of the new component, a production version of the test module, and a production version of a new computer such as a special purpose computer for hosting and running the production version of the test module. Developing the design may include flying the UAV according to a flight that would test for the new capability, and operating the computer to interface with the new component, existing components, and the design and test equipment during the test flight to test the design for the new capability. A portion of the interface (e.g., the interface with the design and test equipment) may be remote (e.g., over a wireless network) and may be performed in real-time or substantially real-time (e.g., during the test flight).

At operation 614, a design plan may be generated based on, for example, the testing. For instance, during or after the flight test, test data may be reviewed and analyzed, updates to the test module may be determined from the test data, updates may be re-tested until a satisfactory performance indicative of the new capability is achieved. A designer may then develop specifications and documentations for the production version of the new component, the production version of the test module, and the production version of the new computer and for interfaces, installations, and integrations of these new production components in the UAV. The new production components may be designed according to commercial aviation standards.

At operation 616, the new production components may be installed and integrated in the UAV based on the design plan. If aviation certification is needed, the new production components and/or the UAV may be certified accordingly. Thereafter, the UAV may enter service and perform the new capability.

Turning to FIG. 7, that figure illustrates an example flow 700 that may be implemented at a computer, such as the computer described in connection with FIG. 6, to support rapid prototyping of a design for a new UAV capability. The example flow 700 may start at operation 702, where the computer may host a module under development. This module may be a test module received from, for example, design and test equipment. In an example, the design and test equipment may transmit, to the computer, a configuration file that may include code for the test module. The test module may be configured to implement a design for testing a new capability of the UAV. This capability may be event-based. In an example, event may necessitate a change to a flight of the UAV if an event is detected.

At operation 704, the computer may cause an existing management system to change a flight based on the detected event. This may be the case when the event may necessitate the change and the new UAV capability may be configured to support the change. In an example, the computer module may interface with a new component or an existing component of the UAV to receive data about the event. In turn, the computer may run the module to process the received data to calculate a change to the flight. Information about the change may then be sent to the management system over an interface between the computer and the management system. The management system may include an existing management module configured to use this information to adjust the flight by managing a propulsion system of the UAV.

Although a change to the flight and interfacing with the management system is illustrated at operation 704, other design or test parameters and interfaces may be used based on the new UAV capability or the detected event. For example, data about a detected event may be collected and transmitted independently of the management system. To illustrate, if the test module is configured to measure distances to obstacles, the computer may transmit distance data to the design and test equipment without changing the flight or interfacing with the management system.

At operation 706, the computer may provide information about the change to the flight and/or the detected event to the design and test equipment. For example, the computer may wirelessly, over a network, and in-real time, or substantially real-time, transmit the event data and the information about the change to the design and test equipment. In turn, this equipment may further process and present the data, the information, and/or an analysis thereof to a user. The user may then be able to ascertain whether the design of the module under design is satisfactory or not. If not, the user may operate the design and test equipment to generate an update to the module. This update may be stored in, for example, a configuration file.

At operation 708, the computer may determine whether any updates may be available for the module. For example, the computer may receive an update, such as a new configuration file, from the design and test equipment. In that case, operation 710 may be performed. If no update is received by the end of the flight, the computer may assume that no updates may be available. In that case, operation 712 may be performed.

At operation 710, the computer may access the update to the module. For example, the computer may receive the update as code stored within a configuration file from the design and ground equipment and may access this code. Operation 710 may also include modifying the module under design based at least in part on the update. For example, the computer may use the received code to replace, edit, or add to currently hosted code of the module and may accordingly update a version identifier of the module. Operation 710 may be followed by operation 702 such that the operations 702-710 may be iteratively repeated until the design test completion as described in connection with operation 712.

At operation 712, the computer may determine that the design testing may be complete. For example, by the end of the flight, the computer may stop receiving data from the new component and may stop the module under design. Further, the computer may perform other testing checks including, for example, transmitting any recorded data, a version identifier of the module under design, and/or other design and test related information to the design and test equipment.

As such, by implementing the example flows 600 and 700 of FIGS. 6 and 7, respectively, rapid prototyping of a design for a new capability may be achieved during a design phase. Thereafter, production versions of tested components may be developed, installed, and integrated and may enter service. In particular, by using a reconfiguration general purpose computer and interfacing this computer with other components of a UAV and with a design and test equipment, a quick and efficient design development may be achieved.

Figure 8:
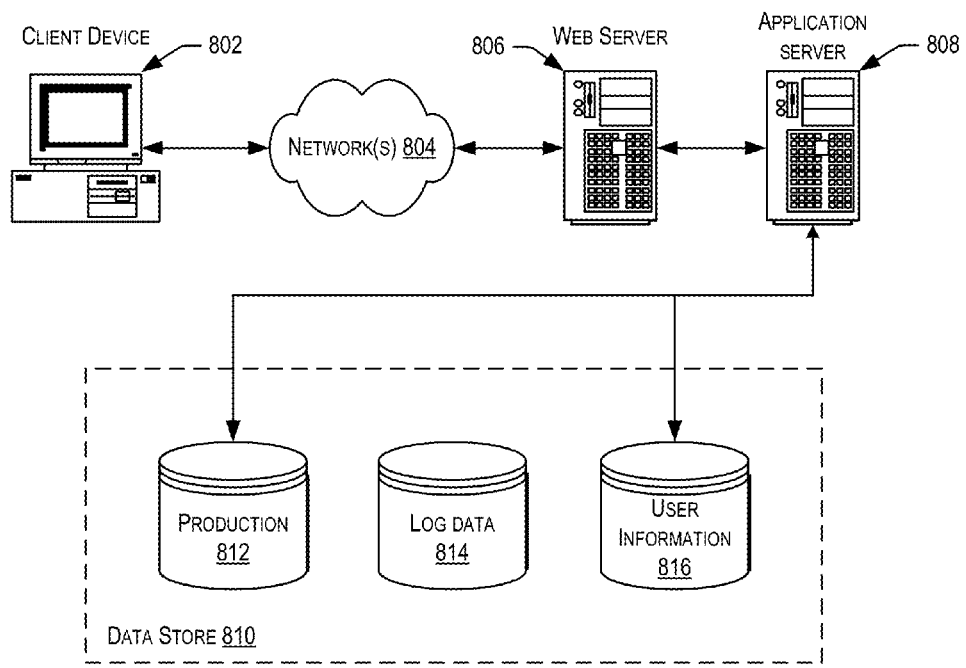
FIG. 8 illustrates an environment in which various embodiments may be implemented.

Turning to FIG. 8, the figure illustrates aspects of an example environment 800 capable of implementing the above-described structures and functions. As will be appreciated, although a Web-based environment is used for purposes of explanation, different environments may be used, as appropriate, to implement various embodiments. The environment includes an electronic client device 802, which may include any appropriate device operable to send and receive requests, messages, or information over an appropriate network(s) 804 and convey information back to a user of the device. Examples of such client devices include personal computers, cell phones, handheld messaging devices, laptop computers, set-top boxes, personal data assistants, electronic book readers, or any other computing device. The network(s) 804 may include any appropriate network, including an intranet, the Internet, a cellular network, a local area network or any other such network or combination thereof. Components used for such a system may depend at least in part upon the type of network and/or environment selected. Protocols and components for communicating via such a network are well known and will not be discussed herein in detail. Communication over the network may be enabled by wired or wireless connections and combinations thereof. In this example, the network includes the Internet, and the environment includes a Web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there may be several application servers, layers, or other elements, processes or components, which may be chained or otherwise configured, which may interact to perform tasks such as obtaining data from an appropriate data store. As used herein the term "data store" refers to any device or combination of devices capable of storing, accessing, and/or retrieving data, which may include any combination and number of data servers, databases, data storage devices and data storage media, in any standard, distributed or clustered environment. The application server may include any appropriate hardware and software for integrating with the data store as needed to execute aspects of one or more applications for the client device, handling a majority of the data access and business logic for an application. The application server 808 provides access control services in cooperation with the data store 810, and is able to generate content such as text, graphics, audio files and/or video files to be transferred to the user, which may be served to the user by the Web server in the form of HTML, XML or another appropriate structured language in this example. The handling of all requests and responses, as well as the delivery of content between the client device 802 and the application server 808, may be handled by the Web server 806. It should be understood that the Web and application servers 806 and 808 are not required and are merely example components, as structured code discussed herein may be executed on any appropriate device or host machine as discussed elsewhere herein.

The data store 810 may include several separate data tables, databases or other data storage mechanisms and media for storing data relating to a particular aspect. For example, the data store 810 illustrated includes mechanisms for storing production data 812 and user information 816, which may be used to serve content for the production side. The data store 810 is also shown to include a mechanism for storing log data 814, which may be used for reporting, analysis, or other such purposes. It should be understood that there may be many other aspects that may need to be stored in the data store 810, such as for page image information and to access correct information, which may be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user, and may access the catalog detail information to obtain information about items of that type. The information then may be returned to the user, such as in a results listing on a web page that the user is able to view via a browser on the client device 802. Information for a particular item of interest may be viewed in a dedicated page or window of the browser.

Each server typically will include an operating system that provides executable program instructions for the general administration and operation of that server, and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of environment 800 in FIG. 8 should be taken as being illustrative in nature, and not limiting to the scope of the disclosure.

The various embodiments further may be implemented in a wide variety of operating environments, which in some cases may include one or more user computers, computing devices or processing devices which may be used to operate any of a number of applications. User or client devices may include any of a number of general purpose personal computers, such as desktop or laptop computers running a standard operating system, as well as cellular, wireless and handheld devices running mobile software and capable of supporting a number of networking and messaging protocols. Such a system also may include a number of workstations running any of a variety of commercially-available operating systems and other known applications for purposes such as development and database management. These devices also may include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIFS, and AppleTalk. The network may be, for example, a local area network, a wide-area network, a virtual private network, the Internet, an intranet, an extranet, a public switched telephone network, an infrared network, a wireless network, and any combination thereof.

In embodiments utilizing a Web server, the Web server may run any of a variety of server or mid-tier applications, including HTTP servers, FTP servers, CGI servers, data servers, Java servers, and business application servers. The server(s) may also be capable of executing programs or scripts in response to requests from user devices, such as by executing one or more Web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment may include a variety of data stores and other memory and storage media as discussed above. These may reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device may include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also may include a computer-readable storage media reader, a communications device (e.g., a modem, a network card (wireless or wired), an infrared communication device, etc.) and working memory as described above. The computer-readable storage media reader may be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer-readable media for containing code, or portions of code, may include any appropriate media known or used in the art, including storage media and communication media, such as but not limited to volatile and non-volatile, removable and non-removable media implemented in any method or technology for storage and/or transmission of information such as computer-readable instructions, data structures, program modules or other data, including RAM, ROM, EEPROM, flash memory or other memory technology, CD-ROM, DVD, or other optical storage, magnetic cassettes, magnetic tape, magnetic disk storage or other magnetic storage devices or any other medium which may be used to store the desired information and which may be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein may be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as that included in the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z in order for each to be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. An unmanned aerial vehicle (UAV), comprising:
   an existing portion comprising:
      a frame;
      a propulsion system connected to the frame;
      a retaining system connected to the frame and configured to retain a package; and
      a management module configured to manage the propulsion system to fly the UAV to a destination;
   a portion under development during a development phase of the UAV and prior to a production phase of the UAV, the portion comprising:
      a sensor connected to the frame; and
      a computing module configured according to a configuration file to generate an adjustment to the propulsion system based at least in part on processing of data generated by the sensor; and
   a temporary portion configured to prototype a computing host of the computing module, the computing host comprising a special purpose computer replacing the temporary portion and hosting the computing module upon completion of the development phase, the temporary portion comprising:
      a general purpose computer storing computer-executable instructions that, upon execution on the general purpose computer, configure the temporary portion to at least:
      host the computing module;
      receive the data generated by the sensor;
      communicate with the management module to adjust the propulsion system based at least in part on the adjustment generated by the computing module;
      provide, to a ground computing node in real time during flight, at least one of: the data or information about the adjustment;

receive, from the ground computing node in real time during flight, a change to the configuration file of the computing module; and update, in real time during flight, the configuration file of the computing module based at least in part on the change.

2. The unmanned aerial vehicle of claim 1, wherein the retained package comprises an item obtained from an electronic marketplace, and wherein the management module is configured to manage a portion of delivering the item as a service associated with the electronic marketplace.

3. The unmanned aerial vehicle of claim 1, wherein the special purpose computer of the computing host is designed based at least in part on the update to the computing module.

4. The unmanned aerial vehicle of claim 1, wherein a design for the computing module and for the computing host is developed based at least in part on the change to the computing module upon completion of the development phase, and wherein the management module is unaffected by the design upon completion of the development phase.

5. An apparatus, comprising:
a first portion of an unmanned aerial vehicle (UAV) having a developed design, the first portion comprising a frame of the UAV;
a propulsion system of the UAV and connected to the frame; and
a management module of the UAV and configured to manage the propulsion system during a flight of the UAV; and
a second portion associated with a design for a capability of the UAV under development during a development phase and prior to a production phase, the second portion comprising:
a component connected to the frame and configured to detect an event; and
an event module configured according to a configuration file to determine a change to the flight based at least in part on data associated with the detected event; and
a computing system configured to prototype a computing host for the event module during the development phase, the computing host comprising a special purpose computer to replace the computing system and host the event module upon completion of the development phase, the computing system comprising:
a general purpose computer storing executable instructions that, upon execution on the general purpose computer, configure the computing system to at least:
host the event module;
provide the change to the flight to the management module;
provide, to a ground computing node, at least one of: the data associated with the detected event or information about the change to the flight;
receive an update to the configuration file of the event module from the ground computing node; and
modify the configuration file of the event module based at least in part on the update.

6. The apparatus of claim 5, wherein the computing system has physical dimensions based at least in part on a size of the apparatus, wherein the physical dimensions avoid necessitating a modification to the management module.

7. The apparatus of claim 5, wherein the management module is hosted at a management system of the apparatus, wherein the first portion of the apparatus comprises the management system, and wherein the management system and the computing system interface based at least in part on a serial connection.

8. The apparatus of claim 5, wherein the computing system is temporarily attached to the apparatus during the development phase, and wherein the computing system is further configured to provide non-design related tasks during the development phase.

9. The apparatus of claim 8, wherein the non-design related tasks comprise sending an e-mail.

10. The apparatus of claim 5, wherein providing at least one of: the data and the information comprises transmitting the data and the information in real-time to the ground computing node over a network.

11. The apparatus of claim 5, wherein the update to the configuration file of the event module comprises code configured to change an operation of the event module, and wherein the update is based at least in part on at least one of: the data associated with the detected event or the information about the change to the flight.

12. The apparatus of claim 5, wherein the update to the configuration file of the event module is received from the ground computing node of a network of computing nodes, and wherein the network is configured to provide an environment for developing and testing a design of the second portion.

13. The apparatus of claim 5, wherein:
the management module is hosted at a management system of the first portion,
the computing system interfaces with the management system based at least in part on a serial connection,
the component comprises a sensor,
the computing system interfaces with the sensor,
the computing system:
receives the data associated with the detected event from the sensor,
provides the data to the event module,
receives the information about the change to the flight from the event module,
provides the information to the management system causing the management module to adjust the flight based at least in part on the change,
transmits the data and the information in real-time to the ground computing node, and
receives the update to the configuration file of the event module in real time from the ground computing node, and
the computing system is reconfigurable to perform non-related design tasks.

14. A computer-implemented method, comprising:
hosting, by a general purpose computer, an event module under design during a development phase and prior to a production phase, the event module associated with an unmanned aerial vehicle (UAV) and configured according to a configuration file to determine a design parameter associated with a flight of the UAV, the design parameter determined based at least in part on a detected event by a sensor of the UAV, the event module to be hosted on a special purpose computer that replaces the general purpose computer based at least in part on the completion of the development phase;
providing information associated with the detected event to a ground computing node, the ground computing node configured to test the design parameter during the development phase of the event module;

accessing an update to the configuration file of the event module from the ground computing node, the update based at least in part on the provided information; and updating the configuration file of the event module based at least in part on the update, the event module having a complete design upon completion of the development phase based at least in part on the update.

15. The computer-implemented method of claim 14, wherein providing the information associated with the detected event to the ground computing node comprises using one or more of: screen forwarding or remote accessing to allow the ground computing node to display the information associated with the detected event.

16. The computer-implemented method of claim 14, wherein providing the information associated with the detected event to the ground computing node comprises transmitting the information to the ground computing node and causing, based at least in part on the transmission, the ground computing node to display the information at a user interface, and wherein the user interface is configured to allow an input and a transmission of the update to configuration file of the event module.

17. The computer-implemented method of claim 14, wherein the complete design comprises a design plan for the special purpose computer, and wherein the special purpose computer is installed within the UAV after the completing of the development phase.

18. The computer-implemented method of claim 17, wherein the event module is hosted by the general purpose computer temporarily attached to the UAV during the development phase, wherein the event module is configured to account for a weight of the general purpose computer relative to a weight of the special purpose computer.

19. The computer-implemented method of claim 14, wherein the event module is hosted by the general purpose computer temporarily attached to the UAV during the development phase, and wherein the general purpose computer interfaces with a power supply of the UAV.

20. The computer-implemented method of claim 14, wherein the event module is hosted by the general purpose computer temporarily attached to the UAV during the development phase, and wherein the general purpose computer comprises a rechargeable battery.

\* \* \* \* \*